United States Patent
See et al.

(10) Patent No.: US 6,371,157 B1
(45) Date of Patent: Apr. 16, 2002

(54) METHOD, SYSTEM AND COMPUTER PROGRAM PRODUCT FOR SELF-DRAINING PLUMBING FOR LIQUID-COOLED DEVICES

(75) Inventors: Alvin B. See, Westfield, MA (US); Richard A. Mitchell, Southington, CT (US)

(73) Assignee: Thales Broadcast & Multimedia, Inc., Southwick, MA (US)

( * ) Notice: Subject to any disclaimer, the term of this patent is extended or adjusted under 35 U.S.C. 154(b) by 0 days.

(21) Appl. No.: 09/672,964

(22) Filed: Sep. 29, 2000

(51) Int. Cl.[7] .............................................. F28D 15/00
(52) U.S. Cl. ........................ 137/565.22; 165/104.31; 700/282
(58) Field of Search ............. 137/565.22, 624.11, 137/624.2; 165/80.4, 104.31; 700/282

(56) References Cited

U.S. PATENT DOCUMENTS

| | | | |
|---|---|---|---|
| 3,776,305 A | * 12/1973 | Simmons | 165/80.4 X |
| 3,835,919 A | 9/1974 | Lambrecht et al. | |
| 4,120,021 A | * 10/1978 | Roush | 165/80.4 X |
| 4,261,332 A | 4/1981 | Stewart | |
| 4,471,907 A | * 9/1984 | Gerstmann | 137/565.22 |
| 4,924,908 A | * 5/1990 | Weiland et al. | 137/565.22 |
| 5,131,859 A | * 7/1992 | Bowen et al. | 165/80.4 X |
| 5,226,471 A | 7/1993 | Stefani | |
| 5,293,554 A | * 3/1994 | Nicholson | 137/624.2 |
| 5,323,847 A | 6/1994 | Koizumi et al. | |
| 5,348,076 A | 9/1994 | Asakawa | |
| 5,400,613 A | 3/1995 | O'Neal | |
| 5,406,807 A | 4/1995 | Ashiwake et al. | |
| 5,435,379 A | 7/1995 | Moslehi et al. | |
| 5,535,818 A | 7/1996 | Fujisaki et al. | |
| 5,887,017 A | 3/1999 | Arthur et al. | |

* cited by examiner

*Primary Examiner*—John Rivell
(74) *Attorney, Agent, or Firm*—Oblon, Spivak, McClelland, Maier & Neustadt, P.C.

(57) ABSTRACT

A system, method and computer program product system for evacuating coolant from a liquid-cooled device. The system includes a coolant supply path adapted to be coupled between a coolant supply pump and the liquid-cooled device; a coolant return path adapted to be coupled between a coolant supply reservoir and the liquid-cooled device; and a coolant removal path coupled between the coolant supply path and the coolant return path. The coolant removal path is configured to evacuate coolant from the liquid-cooled device using a venturi effect from the coolant supply path to evacuate the coolant through the coolant return path into the reservoir.

48 Claims, 4 Drawing Sheets

METHOD, SYSTEM AND COMPUTER PROGRAM PRODUCT FOR SELF-DRAINING PLUMBING FOR LIQUID-COOLED DEVICES

BACKGROUND OF THE INVENTION

1. Field of the Invention

The present invention generally relates to liquid-cooled devices. More particularly, the present invention relates to a method, system and computer program product for removal of liquid coolant from liquid-cooled devices, such as electronic devices, etc., using a venturi effect to drain/siphon coolant out of the devices prior to servicing of the devices and/or prior to removal of the devices from other equipment.

2. Discussion of the Background

Over the years, systems have been developed for accommodating liquid-cooled devices, such as electronic devices, etc., implemented to use a coolant, such as a mixture of water and glycol, for heat removal during operation. These systems typically require periodic, such as yearly, etc., maintenance, wherein the device is removed, necessitating removal of coolant from the device or wherein used coolant is removed from the system and replaced with fresh coolant. This task typically is accomplished by disconnecting the electronic device from the cooling system and using a container to capture the coolant as the coolant discharges from the electronic device and the system.

However, as presently recognized, such conventional systems allow for contamination of the coolant, which is often recycled, allow for loss of coolant during the evacuation process, due to spillage, are inefficient, due to the required disconnection of the electronic devices from the system and require strict adherence to handling concerns, due to the environmental impact of glycol-based coolant products.

SUMMARY OF THE INVENTION

Accordingly, an object of this invention is to provide a novel method, system and computer program product for removal of liquid coolant from devices, such as electronic devices, etc., in a more efficient, safe, coolant conservative and environmentally friendly manner, as compared to conventional methods and systems.

The above and other objects are achieved according to the present invention by providing a novel system, method and computer program product for evacuating coolant from a liquid-cooled device. The system includes a coolant supply path adapted to be coupled between a coolant supply pump and the liquid-cooled device; a coolant return path adapted to be coupled between a coolant supply reservoir and the liquid-cooled device; and a coolant removal path coupled between the coolant supply path and the coolant return path. The coolant removal path is configured to evacuate coolant from the liquid-cooled device using a venturi effect from the coolant supply path to evacuate the coolant through the coolant return path into the reservoir.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
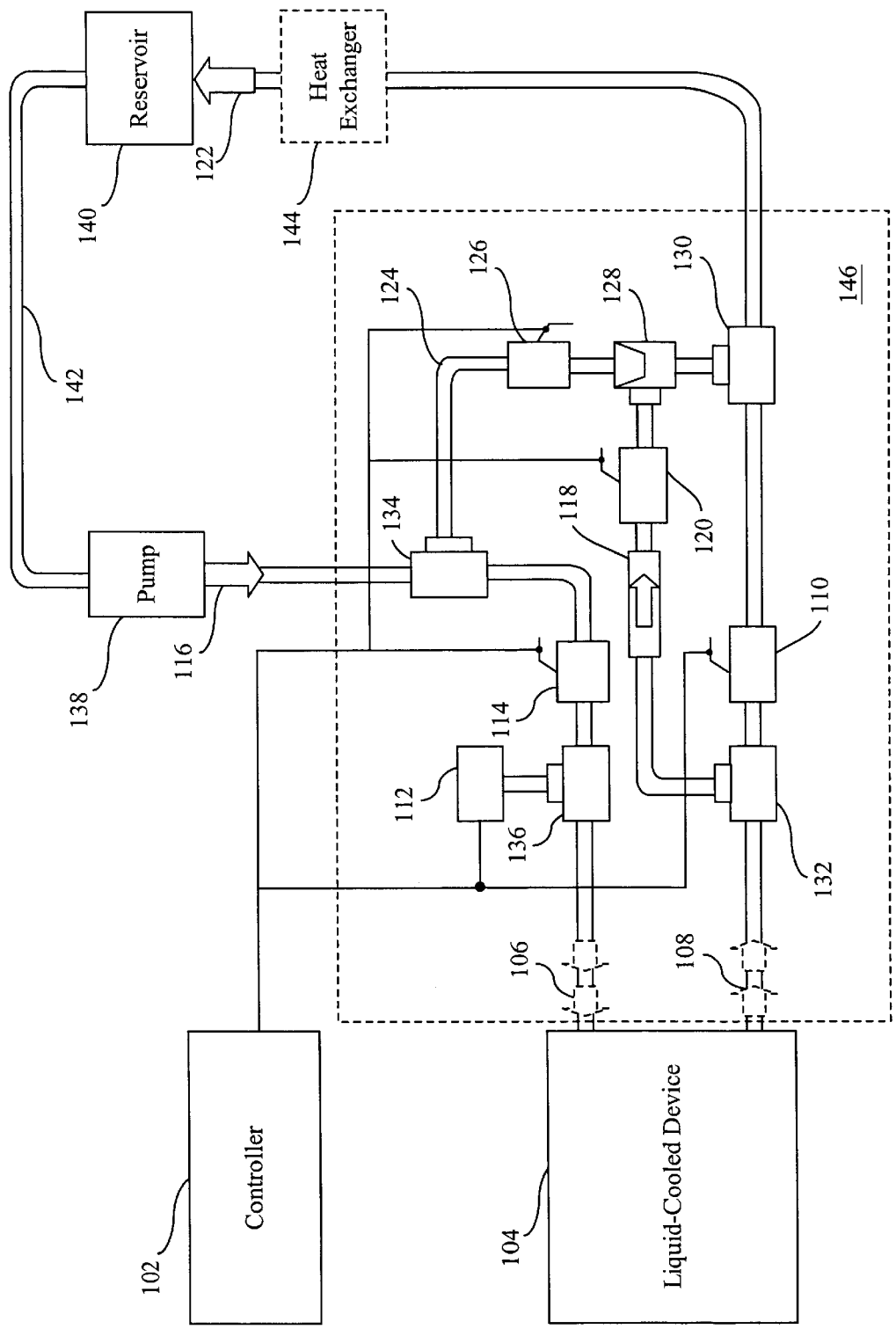
FIG. 1 is a block diagram of a liquid-cooled device system, according to the present invention.

Referring now to the drawings, wherein like reference numerals designate identical or corresponding parts throughout the several views, and more particularly to FIGS. 1–4 thereof, there are shown various embodiments of the present invention, as will now be described.

FIG. 1 is a block diagram of a liquid-cooled device system, according to the present invention. In FIG. 1, the system includes a liquid-cooled device 104, such as an electronic device, a coolant removal/distribution network 146, a coolant pump 138, an optional heat exchanger (not shown) and a coolant reservoir 140. The system may further include an optional controller 102, such as a general-purpose computer or microprocessor, to be described with respect to FIG. 4, coupled to the coolant removal/distribution network 146 for implementing an automatic coolant removal/distribution system. Otherwise, the coolant removal/distribution network 146 may be manually operated. The coolant pump 138, the optional heat exchanger, the coolant reservoir 140 and the optional controller 102 may be shared by one or more liquid-cooled devices 104 and their respective coolant removal/distribution networks 146.

The coolant removal/distribution network 146 includes a coolant supply path, a coolant return path and a coolant removal path. The coolant supply path includes coolant 116 supplied from the pump 138 either directly mounted on the coolant reservoir 140 or via a coolant supply pipe 142 coupled to the coolant reservoir 140. The coolant supply path further includes a tee 134 either directly to the pump 138 or coupled to the pump 138 via a pipe, a device coolant supply shut-off valve 114 coupled to the tee 134, a tee 136 and vacuum relief valve 112 coupled to the device coolant supply shut-off valve 114, and an optional self-sealing quick disconnect 106 coupled between the tee 136 and the liquid-cooled device 104. The optional self-sealing quick disconnect 106 may be included in order to implement a toll-less connect/disconnect function to advantageously prevent spillage of residual coolant.

The coolant return path includes an optional self-sealing quick disconnect 108 coupled to the liquid-cooled device 104, a tee 132 coupled to the optional self-sealing quick disconnect 108, a device coolant return shut-off valve 110 coupled to the tee 132, a tee 130 coupled to the device coolant return shut-off valve 110, and coolant 122 returned to the coolant reservoir 140 either directly or through the optional heat exchanger. The optional self-sealing quick disconnect 108 may be included in order to implement a tool-less connect/disconnect function to advantageously prevent spillage of residual coolant. The coolant removal path includes a first portion 124 coupled to the tee 134, a supply siphon control valve 126 coupled to the first portion 124, a tee with venturi insert 128 (e.g., model number 621 from Nibco, Inc., Elkhart, IN) coupled between the supply siphon control valve 126, the tee 130 and a return siphon control valve 120, and a second portion 118 including a sight glass coupled between the tee 132 and the return siphon control valve 120.

The optional controller 102, for implementing automatic control functions, remote control functions, etc., is coupled to the return siphon control valve 120, the device coolant return shut-off valve 110, the supply siphon control valve 126, the device coolant supply shut-off valve 114 and the vacuum relief valve 112 to effectuate automatic/remote coolant removal/distribution. In this case, the return siphon control valve 120, the device coolant return shut-off valve 110, the supply siphon control valve 126, and the device coolant supply shut-off valve 114 would be implemented using conventional electronically controlled valves. Otherwise, the return siphon control valve 120, the device coolant return shut-off valve 110, the supply siphon control valve 126, and the device coolant supply shut-off valve 114 would be implemented using conventional manual valves.

The present invention uses a venturi effect via the tee with venturi insert 128 to drain/siphon coolant out of the device 104. The cooling system is a forced-circulation (i.e., pumped) system as shown in FIG. 1. The present invention adds a coolant removal path between the supply and return paths. The coolant removal path includes the control valve 126 and the tee with a venturi insert 128 installed therein. The siphon side of the venturi tee 128 connects to the device 104 to be drained upstream of its shutoff valve 110. The vacuum relief valve (e.g., automatic and/or manual valve) 112 also is incorporated to allow air into the coolant lines to replace the coolant that is siphoned out and to facilitate coolant flow to the venturi tee 128. The outlet of the venturi tee 128 is connected downstream of the device 104 coolant exit shut-off valve 110 by a tee 130. The tee 132 located just upstream of the shut-off valve 110 is plumbed to the vacuum inlet of the venturi tee 128. The various shut-off valves 114, 110, 126 and 120 are used to direct the flow during normal operation and during coolant evacuation. The sight glass located in the second portion 118 of the coolant removal path is used to visually verify that the fluid evacuation process has commenced as well as to determine when to stop the bypass process to minimize over-aeration of the coolant. The optional quick disconnects 106 and 108 are employed to facilitate a "tool-less" device/plumbing removal/connection scheme.

In a preferred embodiment of the present invention, one or more pipes connecting the various system components may comprise rigid plumbing, flexible hoses, tubing, etc., or may be eliminated via use of direct coupling of adjacent system components or by use of manifolding techniques to gang or co-locate system components in common blocks, which have been cast or machined with ports and coolant paths to accomplish the system functions disclosed without use of the one or more pipes connecting the various system components.

Figure 2:
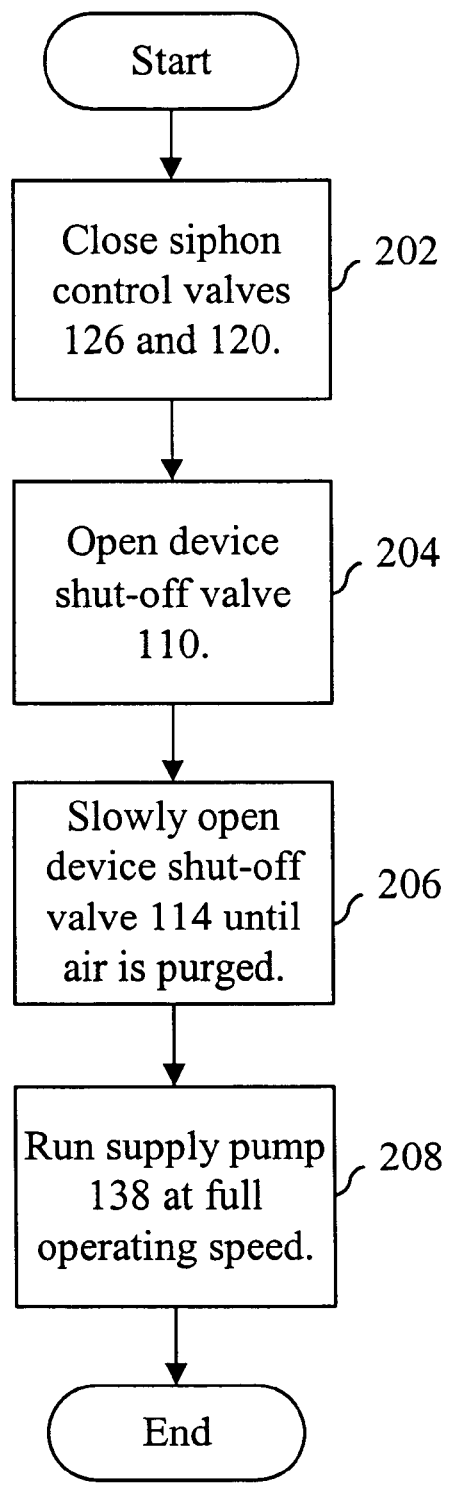
FIG. 2 is a flow chart for illustrating normal operation of the liquid-cooled device system of FIG. 1, according to the present invention.

FIG. 2 is a flow chart for illustrating normal operation of the liquid-cooled device system of FIG. 1, according to the present invention. In FIG. 2, at step 202, the siphon control valves 126 and 120 are closed. At step 204, the device shut-off valve 110 is opened. At step 206, the device shut-off valve 114 is slowly opened until air is purged from the system. At step 208, the supply pump 138 may be operated at full speed, completing the operation.

Figure 3:
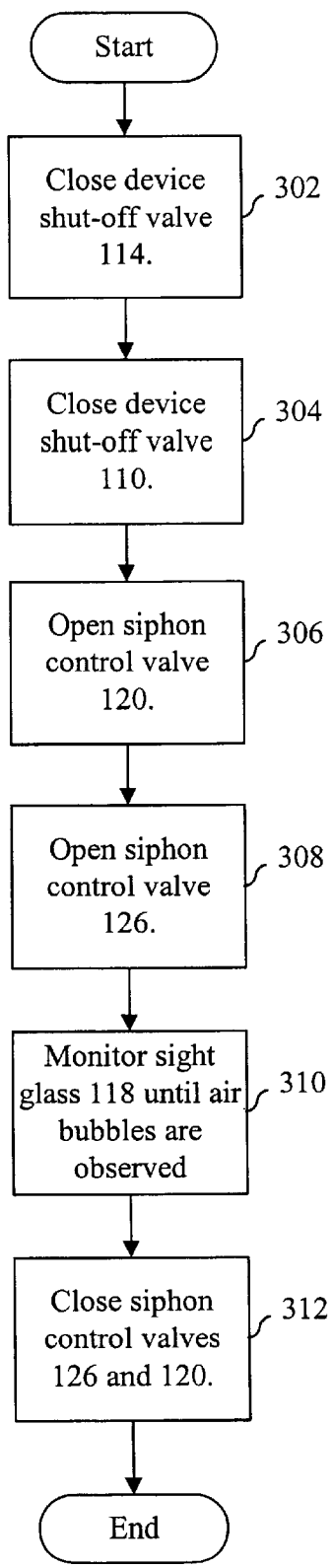
FIG. 3 is a flow chart for illustrating a coolant removal operation of the liquid-cooled device system of FIG. 1, according to the present invention.

FIG. 3 is a flow chart for illustrating a coolant removal operation of the liquid-cooled device system of FIG. 1, according to the present invention. In FIG. 3, at step 302, the device shut-off valve 114 is closed. At step 304, the device shut-off valve 110 is closed. At step 306, the siphon control valve 120 is opened. At step 308, the siphon control valve 126 is opened. At step 310, the sight glass in second portion 118 of the coolant removal path is monitored until air bubbles are observed therein. At step 312, the siphon control valves 126 and 120 are closed, completing the operation.

The present invention may be implemented by an appropriate network of conventional component circuits. The invention may be conveniently implemented using conventional general-purpose computers, microprocessors, digital signal processors, etc., programmed according to the teachings of the present invention, as will be apparent to those skilled in the computer art. Appropriate software can be readily prepared by programmers of ordinary skill based on the teachings of the present disclosure, as will be apparent to those skilled in the software art.

The present invention stores information relating to various processes described herein. This information is stored in one or more memories such as a hard disk, optical disk, magneto-optical disk, and/or RAM, for example. One or more databases may store the information used to implement the present invention. The databases are organized using data structures (e.g., records, tables, arrays, fields, graphs, trees, and/or lists) contained in one or more memories or any of the storage devices listed in the discussion of FIG. 4, for example.

Figure 4:
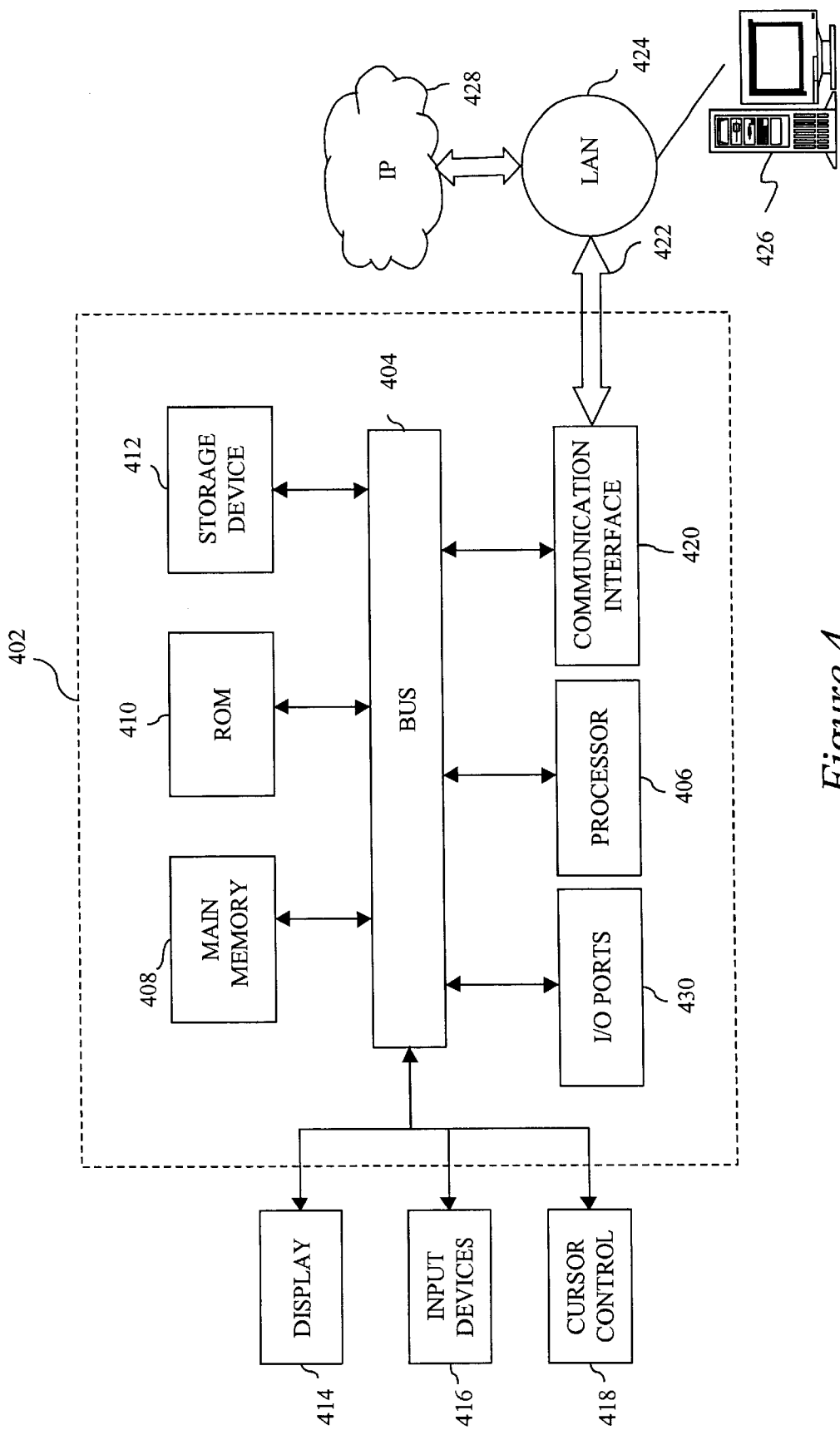
FIG. 4 is a schematic illustration of a general-purpose microprocessor-based or digital signal processor-based system, which can be programmed according to the teachings of the present invention.

FIG. 4 illustrates a computer system 402 (e.g., corresponding to the optional controller 102 of FIG. 1) upon which the present invention may be implemented. The computer system 402 may be any one of a personal computer system, a work station computer system, a lap top computer system, an embedded controller system, a microprocessor-based system, a digital signal processor-based system, a hand held device system, a personal digital assistant (PDA) system, a wireless system, a wireless networking system, etc. The computer system 402 includes a bus 404 or other communication mechanism for communicating information and a processor 406 coupled with bus 404 for processing the information. The computer system 402 also includes a main memory 408, such as a random access memory (RAM) or other dynamic storage device (e.g., dynamic RAM (DRAM), static RAM (SRAM), synchronous DRAM (SDRAM), flash RAM), coupled to bus 404 for storing information and instructions to be executed by processor 406. In addition, main memory 408 may be used for storing temporary variables or other intermediate information during execution of instructions to be executed by processor 406. Computer system 402 further includes a read only memory (ROM) 410 or other static storage device (e.g., programmable ROM (PROM), erasable PROM (EPROM), and electrically erasable PROM (EEPROM)) coupled to bus 404 for storing static information and instructions for processor 406. A storage device 412, such as a magnetic disk or optical disk, is provided and coupled to bus 404 for storing information and instructions.

The computer system 402 also includes input/output ports 430 to couple the computer system 402 to the coolant removal/distribution network 146 to effectuate automatic control thereof, as previously described with respect to FIG. 1. Such coupling may include direct electrical connections, wireless connections, networked connections, etc., for implementing automatic control functions, remote control functions, etc.

The computer system 402 may also include special purpose logic devices (e.g., application specific integrated circuits (ASICs)) or configurable logic devices (e.g., generic array of logic (GAL) or re-programmable field programmable gate arrays (FPGAs)). Other removable media devices (e.g., a compact disc, a tape, and a removable magneto-optical media) or fixed, high-density media drives, may be added to the computer system 402 using an appropriate device bus (e.g., a small computer system interface (SCSI) bus, an enhanced integrated device electronics (IDE) bus, or an ultra-direct memory access (DMA) bus). The computer system 402 may additionally include a compact disc reader, a compact disc reader-writer unit, or a compact disc jukebox, each of which may be connected to the same device bus or another device bus.

The computer system 402 may be coupled via bus 404 to a display 414, such as a cathode ray tube (CRT), liquid crystal display (LCD), voice synthesis hardware and/or software, etc., for displaying and/or providing information to a computer user. The display 414 may be controlled by a display or graphics card. The computer system includes input devices, such as a keyboard 416 and a cursor control 418, for communicating information and command selections to processor 406. Such command selections can be implemented via voice recognition hardware and/or software functioning as the input devices 416. The cursor control 418, for example, is a mouse, a trackball, cursor direction keys, touch screen display, optical character recognition hardware and/or software, etc., for communicating direction information and command selections to processor 406 and for controlling cursor movement on the display 414. In addition, a printer may provide printed listings of the data structures, information, etc., or any other data stored and/or generated by the computer system 402.

The computer system 402 performs a portion or all of the processing steps of the invention in response to processor 406 executing one or more sequences of one or more instructions contained in a memory, such as the main memory 408. Such instructions may be read into the main memory 408 from another computer readable medium, such as storage device 412. One or more processors in a multi-processing arrangement may also be employed to execute the sequences of instructions contained in main memory 408. In alternative embodiments, hard-wired circuitry may be used in place of or in combination with software instructions. Thus, embodiments are not limited to any specific combination of hardware circuitry and software.

As stated above, the system 402 includes at least one computer readable medium or memory programmed according to the teachings of the invention and for containing data structures, tables, records, or other data described herein. Examples of computer readable media are compact discs, hard disks, floppy disks, tape, magneto-optical disks, PROMs (EPROM, EEPROM, Flash EPROM), DRAM, SRAM, SDRAM, etc. Stored on any one or on a combination of computer readable media, the present invention includes software for controlling the computer system 402, for driving a device or devices for implementing the invention, and for enabling the computer system 402 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpreted or executable code mechanism, including but not limited to scripts, interpreters, dynamic link libraries, Java classes, and complete executable programs. Moreover, parts of the processing of the present invention may be distributed for better performance, reliability, and/or cost.

The term "computer readable medium" as used herein refers to any medium that participates in providing instructions to processor 406 for execution. A computer readable medium may take many forms, including but not limited to, non-volatile media, volatile media, and transmission media. Non-volatile media includes, for example, optical, magnetic disks, and magneto-optical disks, such as storage device 412. Volatile media includes dynamic memory, such as main memory 408. Transmission media includes coaxial cables, copper wire and fiber optics, including the wires that comprise bus 404. Transmission media also may also take the form of acoustic or light waves, such as those generated during radio wave and infrared data communications.

Common forms of computer readable media include, for example, hard disks, floppy disks, tape, magneto-optical disks, PROMs (EPROM, EEPROM, Flash EPROM), DRAM, SRAM, SDRAM, or any other magnetic medium, compact disks (e.g., CD-ROM), or any other optical medium, punch cards, paper tape, or other physical medium with patterns of holes, a carrier wave (described below), or any other medium from which a computer can read.

Various forms of computer readable media may be involved in carrying out one or more sequences of one or more instructions to processor 406 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to computer system 402 may receive the data on the telephone line and use an infrared transmitter to convert the data to an infrared signal. An infrared detector coupled to bus 404 can receive the data carried in the infrared signal and place the data on bus 404. The bus 404 carries the data to main memory 408, from which processor 406 retrieves and executes the instructions. The instructions received by main memory 408 may optionally be stored on storage device 412 either before or after execution by processor 406.

The computer system 402 also includes a communication interface 420 coupled to bus 404. Communication interface 420 provides a two-way data communication coupling to a network link 422 that may be connected to, for example, a local network 424. For example, communication interface 420 may be a network interface card to attach to any packet switched local area network (LAN). As another example, communication interface 420 may be an asymmetrical digital subscriber line (ADSL) card, an integrated services digital network (ISDN) card or a modem to provide a data communication connection to a corresponding type of telephone line. Wireless links may also be implemented via the communication interface 420. In any such implementation, communication interface 420 sends and receives electrical, electromagnetic or optical signals that carry digital data streams representing various types of information.

Network link 422 typically provides data communication through one or more networks to other data devices. For example, network link 422 may provide a connection to a computer 426 through local network 424 (e.g., a LAN) or through equipment operated by a service provider, which provides communication services through a communications network 428. In preferred embodiments, local network 424 and communications network 428 preferably use electrical, electromagnetic, or optical signals that carry digital data streams. The signals through the various networks and the signals on network link 422 and through communication interface 420, which carry the digital data to and from computer system 402, are exemplary forms of carrier waves transporting the information. The computer system 402 can transmit notifications and receive data, including program code, through the network(s), network link 422 and communication interface 420.

Although the present invention is described in terms of coolant removal from liquid-cooled electronic devices, the present invention is applicable to coolant removal from other types of liquid-cooled devices, such as transmissions, radiators, refrigerators, etc., as will be appreciated by those of ordinary skill in the relevant art(s).

Although the present invention is described in terms of the vacuum relief valve 112 being coupled to the tee 136 and the second portion 118 of the coolant removal path including the sight glass connected to the tee 132, as shown in FIG. 1, the vacuum relief valve 112 could be coupled to the tee 132 and the second portion 118 could be connected to the tee 136, to allow for system implementations wherein the liquid-cooled device is provided at a lower level than the optional quick disconnects 108 coolant outlet, as will be appreciated by those of ordinary skill in the relevant art(s).

Numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A system for evacuating coolant from a liquid-cooled device, comprising:
   a coolant supply path adapted to be coupled between a coolant supply pump and the liquid-cooled device;
   a coolant return path adapted to be coupled between a coolant supply reservoir and the liquid-cooled device; and
   a coolant removal path comprising a first portion coupled between the coolant supply path and the coolant return path and a second portion coupled between the coolant return path and the first portion and configured to evacuate coolant from the liquid-cooled device using a venturi effect from the coolant supply path to evacuate the coolant through the coolant return path into the reservoir.

2. The system of claim 1, wherein the coolant removal path includes a venturi effect device, and
   the venturi effect device is coupled between the coolant supply path and the liquid-cooled device and between the return path and the reservoir.

3. The system of claim 2, wherein the coolant removal path includes a supply siphon control valve coupled between the venturi effect device and the coolant supply path.

4. The system of claim 2, wherein the coolant removal path includes a return siphon control valve coupled between the return path and the venturi effect device.

5. The system of claim 2, wherein the coolant removal path includes a sight glass coupled between the return path and the venturi effect device.

6. The system of claim 1, wherein the coolant supply path includes a coolant supply device shut-off valve coupled between the pump and the liquid-cooled device.

7. The system of claim 1, wherein the coolant return path includes a coolant return device shut-off valve coupled between the liquid-cooled device and the reservoir.

8. The system of claim 1, wherein the coolant supply path includes a supply self-sealing quick-disconnect device coupled to the liquid-cooled device.

9. The system of claim 1, wherein the return path includes a return self-sealing quick-disconnect device coupled to the liquid-cooled device.

10. The system of claim 1, wherein the coolant supply path includes a vacuum relief valve coupled between the pump and the liquid-cooled device.

11. The system of claim 1, wherein the coolant removal path includes a venturi effect device, and the venturi effect device is coupled between the coolant supply path and the reservoir and between the return path and the reservoir,
   the coolant removal path includes a supply siphon control valve coupled between the venturi effect device and the coolant supply path,
   the coolant removal path includes a return siphon control valve coupled between the return path and the venturi effect device,
   the coolant supply path includes a coolant supply device shut-off valve coupled between the pump and the liquid-cooled device, and
   the coolant return path includes a coolant return device shut-off valve coupled between the liquid-cooled device and the reservoir.

12. The system of claim 11, further comprising:
   a controller coupled to the supply and return siphon control valves and the coolant supply and return device shut-off valves.

13. The system of claim 12, wherein the controller is configured to close the supply and return siphon control valves and open the coolant supply and return device shut-off valves during normal operation.

14. The system of claim 12, wherein the controller is configured to open the supply and return siphon control valves and close the coolant supply and return device shut-off valves during a coolant evacuation operation.

15. The system of claim 11, wherein, during normal operation, the supply and return siphon control valves are in closed position and the coolant supply and return device shut-off valves are in an opened position.

16. The system of claim 11, wherein, during a coolant evacuation operation, the supply and return siphon control valves are in an opened position and the coolant supply and return device shut-off valves are in a closed position.

17. A method for evacuating coolant from a liquid-cooled device, comprising:
   coupling a coolant supply path between a coolant supply pump and the liquid-cooled device;
   coupling a coolant return path between a coolant supply reservoir and the liquid-cooled device;
   coupling a first portion of a coolant removal path between the coolant supply path and the coolant return path and coupling a second portion of said coolant removal path between the coolant return path and the first portion; and
   evacuating coolant from the liquid-cooled device using a venturi effect from the coolant supply path to evacuate the coolant through the coolant return path into the reservoir.

18. The method of claim 17, further comprising:
   providing in the coolant removal path a venturi effect device; and
   coupling the venturi effect device between the coolant supply path and the liquid-cooled device and between the return path and the reservoir.

19. The method of claim 18, further comprising:
   providing in the coolant removal path a supply siphon control valve; and
   coupling the supply siphon control valve between the venturi effect device and the coolant supply path.

20. The method of claim 18, further comprising:
providing in the coolant removal path a return siphon control valve; and
coupling the return siphon control valve between the return path and the venturi effect device.

21. The method of claim 18, further comprising:
providing in the coolant removal path a sight glass; and
coupling the sight glass between the return path and the venturi effect device.

22. The method of claim 17, further comprising:
providing in the coolant supply path a coolant supply device shut-off valve; and
coupling coolant supply device shut-off valve between the pump and the liquid-cooled device.

23. The method of claim 17, further comprising:
providing in the coolant return path a coolant return device shut-off valve; and
coupling the coolant return device shut-off valve between the liquid-cooled device and the reservoir.

24. The method of claim 17, further comprising:
providing in the coolant supply path a supply self-sealing quick-disconnect device; and
coupling the supply self-sealing quick-disconnect device to the liquid-cooled device.

25. The method of claim 17, further comprising:
providing in the return path a return self-sealing quick-disconnect device; and
coupling the return self-sealing quick-disconnect device to the liquid-cooled device.

26. The method of claim 17, further comprising:
providing in the coolant supply path a vacuum relief valve; and
coupling the vacuum relief valve between the pump and the liquid-cooled device.

27. The method of claim 17, further comprising:
providing in the coolant removal path a venturi effect device, the venturi effect device coupled between the coolant supply path and the reservoir and between the return path and the reservoir;
providing in the coolant removal path a supply siphon control valve coupled between the venturi effect device and the coolant supply path,
providing in the coolant removal path a return siphon control valve coupled between the return path and the venturi effect device,
providing in the coolant supply path a coolant supply device shut-off valve coupled between the pump and the liquid-cooled device; and
providing in the coolant return path a coolant return device shut-off valve coupled between the liquid-cooled device and the reservoir.

28. The method of claim 27, further comprising:
providing a controller coupled to the supply and return siphon control valves and the coolant supply and return device shut-off valves.

29. The method of claim 28, further comprising:
configuring the controller to close the supply and return siphon control valves and open the coolant supply and return device shut-off valves during normal operation.

30. The method of claim 28, further comprising:
configuring the controller to open the supply and return siphon control valves and close the coolant supply and return device shut-off valves during a coolant evacuation operation.

31. The method of claim 27, further comprising:
closing the supply and return siphon control valves and opening the coolant supply and return device shut-off valves during normal operation.

32. The method of claim 27, further comprising:
opening the supply and return siphon control valves and closing the coolant supply and return device shut-off valves during a coolant evacuation operation.

33. A computer program product comprising a computer storage medium having a computer program code mechanism embedded in the computer storage medium for evacuating coolant from a liquid-cooled device, the computer program code mechanism performing the steps of:
coupling a coolant supply path between a coolant supply pump and the liquid-cooled device;
coupling a coolant return path between a coolant supply reservoir and the liquid-cooled device;
coupling a first portion of a coolant removal path between the coolant supply path and the coolant return path and coupling a second portion of said coolant removal path between the coolant return path and the fist portion; and
evacuating coolant from the liquid-cooled device using a venturi effect from the coolant supply path to evacuate the coolant through the coolant return path into the reservoir.

34. The computer program product of claim 33, wherein the computer program code mechanism further performs the steps of:
providing in the coolant removal path a venturi effect device; and
coupling the venturi effect device between the coolant supply path and the liquid-cooled device and between the return path and the reservoir.

35. The computer program product of claim 34, wherein the computer program code mechanism further performs the steps of:
providing in the coolant removal path a supply siphon control valve; and
coupling the supply siphon control valve between the venturi effect device and the coolant supply path.

36. The computer program product of claim 34, wherein the computer program code mechanism further performs the steps of:
providing in the coolant removal path a return siphon control valve; and
coupling the return siphon control valve between the return path and the venturi effect device.

37. The computer program product of claim 34, wherein the computer program code mechanism further performs the steps of:
providing in the coolant removal path a sight glass; and
coupling the sight glass between the return path and the venturi effect device.

38. The computer program product of claim 33, wherein the computer program code mechanism further performs the steps of:
providing in the coolant supply path a coolant supply device shut-off valve; and
coupling coolant supply device shut-off valve between the pump and the liquid-cooled device.

39. The computer program product of claim 33, wherein the computer program code mechanism further performs the steps of:
providing in the coolant return path a coolant return device shut-off valve; and coupling the coolant return device shut-off valve between the liquid-cooled device and the reservoir.

40. The computer program product of claim 33, wherein the computer program code mechanism further performs the steps of:

providing in the coolant supply path a supply self-sealing quick-disconnect device; and coupling the supply self-sealing quick-disconnect device to the liquid-cooled device.

41. The computer program product of claim 33, wherein the computer program code mechanism further performs the steps of:

providing in the return path a return self-sealing quick-disconnect device; and coupling the return self-sealing quick-disconnect device to the liquid-cooled device.

42. The computer program product of claim 33, wherein the computer program code mechanism further performs the steps of:

providing in the coolant supply path a vacuum relief valve; and coupling the vacuum relief valve between the pump and the liquid-cooled device.

43. The computer program product of claim 33, wherein the computer program code mechanism further performs the steps of:

providing in the coolant removal path a venturi effect device, the venturi effect device coupled between the coolant supply path and the reservoir and between the return path and the reservoir;

providing in the coolant removal path a supply siphon control valve coupled between the venturi effect device and the coolant supply path, providing in the coolant removal path a return siphon control valve coupled between the return path and the venturi effect device, providing in the coolant supply path a coolant supply device shut-off valve coupled between the pump and the liquid-cooled device; and providing in the coolant return path a coolant return device shut-off valve coupled between the liquid-cooled device and the reservoir.

44. The computer program product of claim 43, wherein the computer program code mechanism further performs the steps of:

providing a controller coupled to the supply and return siphon control valves and the coolant supply and return device shut-off valves.

45. The computer program product of claim 44, wherein the computer program code mechanism further performs the steps of:

configuring the controller to close the supply and return siphon control valves and open the coolant supply and return device shut-off valves during normal operation.

46. The computer program product of claim 44, wherein the computer program code mechanism further performs the steps of:

configuring the controller to open the supply and return siphon control valves and close the coolant supply and return device shut-off valves during a coolant evacuation operation.

47. The computer program product of claim 43, further comprising:

closing the supply and return siphon control valves and opening the coolant supply and return device shut-off valves during normal operation.

48. The computer program product of claim 43, wherein the computer program code mechanism further performs the steps of:

opening the supply and return siphon control valves and closing the coolant supply and return device shut-off valves during a coolant evacuation operation.

* * * * *